United States Patent
Nishiyama et al.

(10) Patent No.: US 7,220,684 B2
(45) Date of Patent: May 22, 2007

(54) SEMICONDUCTOR DEVICE AND METHOD OF MANUFACTURING THE SAME

(75) Inventors: Norikazu Nishiyama, Osaka (JP); Korekazu Ueyama, Hyogo (JP); Yoshiaki Oku, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 10/187,192

(22) Filed: Jun. 28, 2002

(65) Prior Publication Data
US 2003/0006507 A1    Jan. 9, 2003

(30) Foreign Application Priority Data
Jun. 29, 2001    (JP)    .................... P.2001-198942

(51) Int. Cl.
*H01L 21/31* (2006.01)
*H01L 21/469* (2006.01)

(52) U.S. Cl. ............... 438/781; 438/783; 257/E21.209; 257/E21.273; 257/E29.272

(58) Field of Classification Search ........ 438/780–782, 438/783
See application file for complete search history.

(56) References Cited

U.S. PATENT DOCUMENTS 5,103,288 A * 4/1992 Sakamoto et al. .......... 257/758
6,464,853 B1 * 10/2002 Iwasaki et al. ............. 205/118
6,576,568 B2 * 6/2003 Mandal et al. .............. 438/781

* cited by examiner

*Primary Examiner*—Alexander Ghyka
(74) *Attorney, Agent, or Firm*—Hamre, Schumann, Mueller & Larson, P.C.

(57) ABSTRACT

There is included an inorganic insulating film having a porous structure including a cylindrical vacancy oriented in parallel with the surface of a substrate subjected to a hydrophilic treatment or a hydrophobic treatment.

6 Claims, 6 Drawing Sheets

D1 > D2

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and more particularly to an inorganic dielectric film having a low dielectric constant.

2. Description of the Related Art

In order to increase a speed and to reduce power consumption in a semiconductor device, it is an important object to reduce the dielectric constant of an interlayer insulating film. The interlayer insulating film has variously been devised in order to reduce the dielectric constant. In a conventional semiconductor device, the following methods have been proposed:

(1) to add fluorine to a silica film to be an inorganic insulating film;

(2) to form an organic insulating material having a low dielectric constant as a parent material; and (3) to intentionally form a porous film.

In the case of the method (1), however, since a heat resistance and a mechanical strength in the insulating film are deteriorated, the addition is carried out in an element ratio of several % at most. Consequently, there is a problem in that a relative dielectric constant can be reduced by only 10 to 15% of that of a conventional silica based interlayer insulating film.

In the case of the method (2), moreover, the organic material is formed. For this reason, there is a problem in that the heat resistance is considerably deteriorated as compared with a conventional silica based interlayer insulating film, resulting in a reduction in the reliability of a semiconductor element.

In the case of the method (3), furthermore, since a porous structure is random, the mechanical strength of the interlayer insulating film is remarkably reduced and the insulating film is apt to be broken in packaging, causing a reduction in the reliability of a semiconductor element.

In many cases, moreover, the porous structure is not closed. If the porous structure is not closed, the moisture resistance of the interlayer insulating film is remarkably deteriorated, causing a reduction in the reliability of the semiconductor element.

In the conventional insulating film, thus, there is a problem in that the dielectric constant cannot be reduced sufficiently, and furthermore, the mechanical strength is also insufficient.

Moreover, a line capacitance becomes a great problem in a region in which a signal line is particularly formed on the same substrate. On the other hand, in some cases, it is necessary to form a fine film having a high insulating property in a region in which a large current flows.

SUMMARY OF THE INVENTION

In consideration of the circumstances, it is an object of the invention to provide a semiconductor device capable of regulating a vacancy rate in a substrate and adjusting a dielectric constant to have a desirable value.

Moreover, it is another object of the invention to provide an insulating film having a low dielectric constant and a high mechanical strength.

Furthermore, it is a further object of the invention to particularly provide an insulating film having a high moisture resistance and a low dielectric constant.

Therefore, the invention provides a semiconductor device comprising an inorganic insulating film having a porous structure including a cylindrical vacancy which is oriented in parallel with a surface of a substrate subjected to a hydrophilic treatment or a hydrophobic treatment.

According to such a structure, in the case in which the surface of the substrate is subjected to the hydrophilic treatment or the hydrophobic treatment to form the insulating film having the porous structure including the cylindrical vacancy on the surface of the substrate subjected to the hydrophobic treatment and including a hydrophobic layer if as shown in a view of FIG. 1(c), a vacancy diameter D1 is more increased by enlargement than that in the case in which the hydrophobic treatment is not carried out so that an inorganic insulating film having a higher vacancy rate is formed. Consequently, the same phenomenon occurs also on an originally hydrophobic substrate surface. There is such a characteristic that only the vacancy rate can be increased without changing the structure of the vacancy and the regulation of the vacancy rate can easily be carried out. More specifically, it is possible to change a spacing by approximately 10% in the porous structure depending on the polarity of the substrate and to change the vacancy rate by approximately 20%.

On the other hand, in the case in which an insulating film having a porous structure including a cylindrical vacancy is to be formed on the surface of the substrate subjected to the hydrophilic treatment and containing a hydrophilic layer lu, a vacancy diameter D2 is reduced to be smaller than that in the case in which the hydrophilic treatment is not carried out. Consequently, an inorganic insulating film having a lower vacancy rate is formed (D1>D2). Thus, a substrate layer on which an inorganic insulating film having a vacancy is to be formed is reformed by a hydrophobic or hydrophilic layer having a molecular level. Consequently, it is possible to easily regulate a vacancy rate and to adjust a dielectric constant with the mechanical strength of the film maintained.

According to the inorganic insulating film, moreover, it is possible to increase a moisture resistance. Furthermore, since the inorganic insulating film has the porous structure, the dielectric constant can be more decreased than that obtained by the addition of fluorine because the air has a low dielectric constant. Thus, the dielectric constant of the insulating film can be reduced as much as possible.

According to such a structure, moreover, since the vacancy is oriented in parallel with the surface of the substrate, a low dielectric constant is uniformly obtained in a direction perpendicular to the surface of the substrate. In the case in which the insulating film is to be used as an interlayer insulating film, particularly, it is possible to employ such a closed structure that an opening portion is not provided for an upper wiring and a lower wiring. Thus, the insulating film can serve as an effective thin film having a low dielectric constant which has an excellent moisture resistance and a high reliability.

It is desirable that there should be a plurality of periodic porous structure domains formed on the surface of the substrate and including a cylindrical vacancy oriented in one direction in parallel with the surface of the substrate, and the adjacent porous structure domains should be oriented in different directions from each other.

According to such a structure, the porous structure is oriented in a different direction for each domain. Therefore, the opening portions of the vacancies can be closed each other, and it is possible to obtain a thin film having an extremely low dielectric constant in which a moisture resistance is almost as high as that of a fine film and the periodic structure can also give a high mechanical strength.

It is desirable that the inorganic insulating film should be an interlayer insulating film provided between a semiconductor substrate or a lower wiring conductor formed on the semiconductor substrate and an upper wiring conductor.

According to such a structure, it is possible to reduce the dielectric constant of the interlayer insulating film. Therefore, it is possible to provide a semiconductor device for carrying out a high-speed driving operation by reducing a layer capacitance.

It is desirable that a part of the substrate should be selectively subjected to the hydrophilic treatment or the hydrophobic treatment and there should be regions on the same substrate surface in which the cylindrical vacancy has different diameters.

According to such a structure, it is possible to easily regulate the vacancy rate and to easily adjust the dielectric constant by the hydrophobic treatment or the hydrophilic treatment.

A second aspect of the invention is directed to a method of manufacturing a semiconductor device comprising a step of generating a precursor solution containing a silica derivative and a surfactant, a surface regulating step of carrying out a hydrophobic treatment or a hydrophilic treatment on a surface of a substrate, a contact step of causing the precursor solution to come in contact with the surface of the substrate, and a step of burning the substrate with which the precursor solution is caused to come in contact and decomposing and removing the surfactant, wherein an insulating film having a porous structure is formed.

According to such a structure, a surfacing treatment is carried out prior to the film formation with a very high controllability. Consequently, it is possible to regulate the dielectric constant. Thus, it is possible to provide an insulating film having a high moisture resistance, a great mechanical strength and an extremely low dielectric constant. Moreover, the insulating film can be formed at a low temperature. Also in the case in which the insulating film is to be used as the interlayer insulating film of an integrated circuit, therefore, the insulating film having a high reliability can be formed without influencing a substrate.

It is desirable that the method should further comprise a preliminary crosslinking step of raising a temperature of the precursor solution to start a crosslinking reaction.

More specifically, the preliminary crosslinking is carried out prior to the contact step of causing the precursor solution to come in contact with the surface of the substrate. Consequently, it is possible to more enhance a productivity.

Furthermore, it is possible to properly change the vacancy rate by regulating the concentration of the precursor solution, and it is possible to form an insulating thin film having a desirable dielectric constant with a very high workability.

It is desirable that the substrate should be immersed in the precursor solution at the contact step.

According to such a structure, it is possible to form an insulating film having a low dielectric constant with a high productivity.

Moreover, it is desirable that the substrate should be immersed in the precursor solution and should be pulled up at a desirable speed in the contact step.

According to such a structure, it is possible to form an insulating film having a low dielectric constant with a high productivity.

It is desirable that the substrate should be coated with the precursor solution at the contact step.

According to such a structure, it is possible to form an insulating film having a low dielectric constant with a high productivity.

It is desirable that the contact step should be a spin coating step of dropping the precursor solution onto the substrate and rotating the substrate.

According to such a structure, the thickness of the film and the vacancy rate can be regulated easily so that an insulating film having a low dielectric constant can be formed with a high productivity.

DESCRIPTION OF THE PREFERRED EMBODIMENTS

A semiconductor device and a method of manufacturing the semiconductor device according to an embodiment of the invention will be described in detail with reference to the drawings.

First Embodiment

As a first embodiment of the invention, description will be given to an FRAM using a thin film having a low dielectric constant as an interlayer insulating film.

Figure 1:
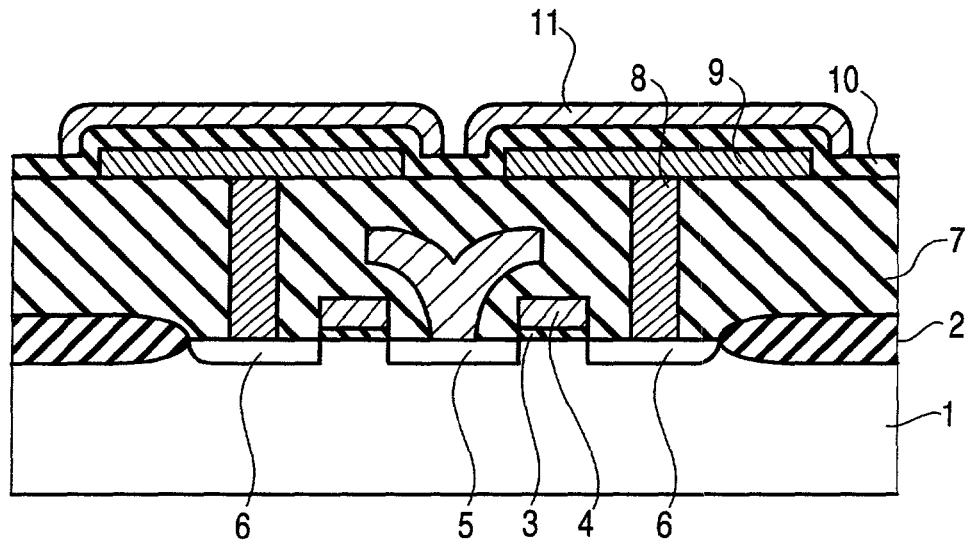
FIGS. 1(a)–1(c) show views showing an FRAM using an insulating film formed by a method according to a first embodiment of the invention.
Figure 1:
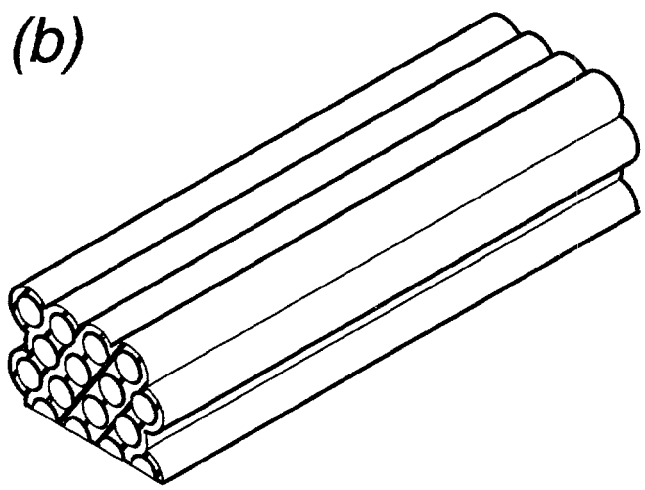
Figure 1:
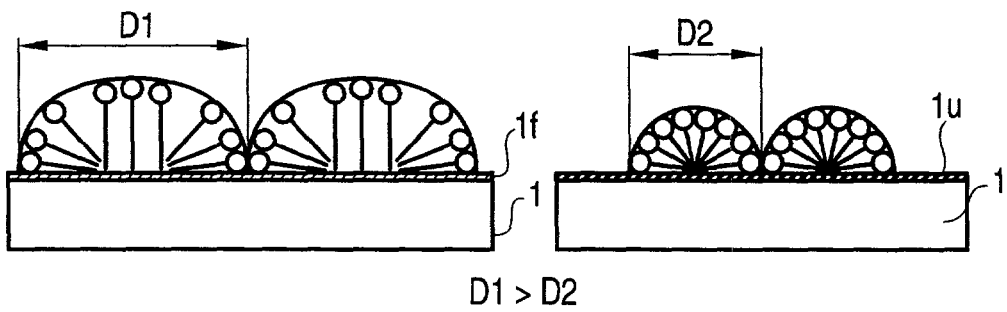

As shown in FIGS. 1(a) and 1(b), the FRAM comprises a switching transistor formed in an element region surrounded by an element isolating film 2 provided on the surface of a silicon substrate 1 and a ferroelectric capacitor. The invention is characterized in that a thin film 7 having a low dielectric constant according to the invention is used as an interlayer insulating film between the switching transistor and a lower electrode 9 of the ferroelectric capacitor. As shown in an enlarged perspective view showing a main part of FIG. 1(b), the thin film having a low dielectric constant comprises an inorganic insulating film having a porous structure including a cylindrical vacancy which is oriented in parallel with the surface of the substrate.

Others are formed by an ordinary method. The switching transistor is constituted by a gate electrode 4 formed on the surface of the silicon substrate 1 through a gate insulating film 3, and a source region 5 and a drain region 6 which are formed to interpose the gate electrode 4 therebetween. A lower electrode 9 is connected to the drain region 6 through a contact 8, while the source region 5 is connected to a bit line BL.

On the other hand, the ferroelectric capacitor is obtained by interposing a ferroelectric thin film 10 comprising PZT between the lower electrode 9 and an upper electrode 11.

According to such a structure, the surface of the substrate on which an interlayer insulating film 7 is to be formed is hydrophobic over the source—drain region and the gate electrode 4. Therefore, the structure corresponds to the case in which an insulating film having a porous structure including a cylindrical vacancy is to be formed on the surface of a substrate including a hydrophobic layer 1f as shown on the left of a view in FIG. 1(c), and a vacancy diameter D1 is increased by enlargement so that an inorganic insulting film having a higher vacancy rate is formed.

On the other hand, in the same manner as in the case in which an insulating film having a porous structure including a cylindrical vacancy is to be formed on the surface of a substrate including a hydrophilic layer 1u, a vacancy diameter D2 is reduced over the element isolating film 2 to be a hydrophilic surface so that an inorganic insulating film having a lower vacancy rate is formed (D1>D2).

Therefore, the whole surface is subjected to a hydrophobic treatment, and the hydrophobic layer 1f is formed and an interlayer insulating film 7 is formed thereon.

Thus, the vacancy rate is regulated with the mechanical strength of the film maintained. Consequently, it is possible to obtain a porous structure having a high vacancy rate on an element isolating film and to easily regulate a dielectric constant.

Thus, a substrate layer on which an inorganic insulating film having a vacancy is to be formed is reformed by a hydrophobic layer having a molecular level so that the regulation can be carried out extremely easily.

Referring to FIGS. 2(a) to 2(d), a process for manufacturing the FRAM will be described.

Figure 2:
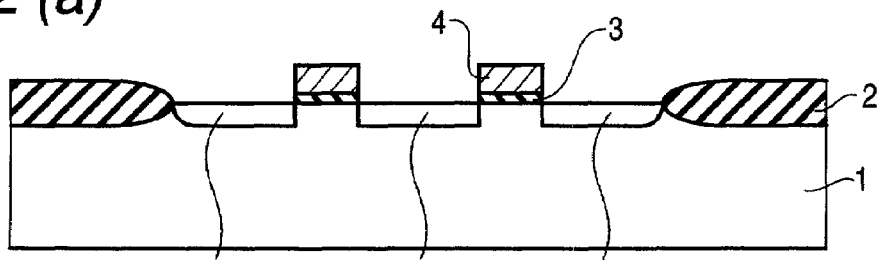
FIGS. 2(a)–2(d) show views showing a process for manufacturing the FRAM in FIG. 1, FIGS. 3(a)–3(b) show views illustrating a process for forming the insulating film according to the first embodiment of the invention.
Figure 2:
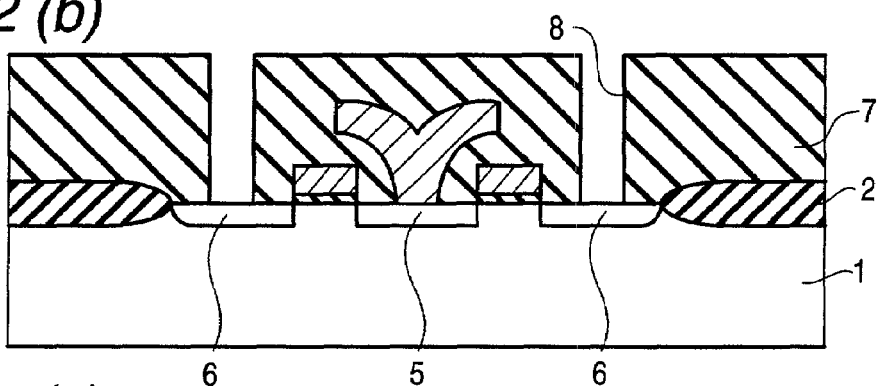
Figure 2:
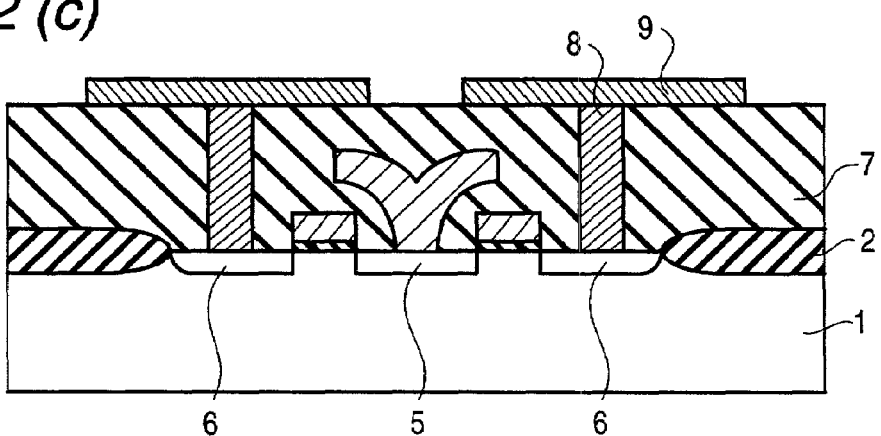
Figure 2:
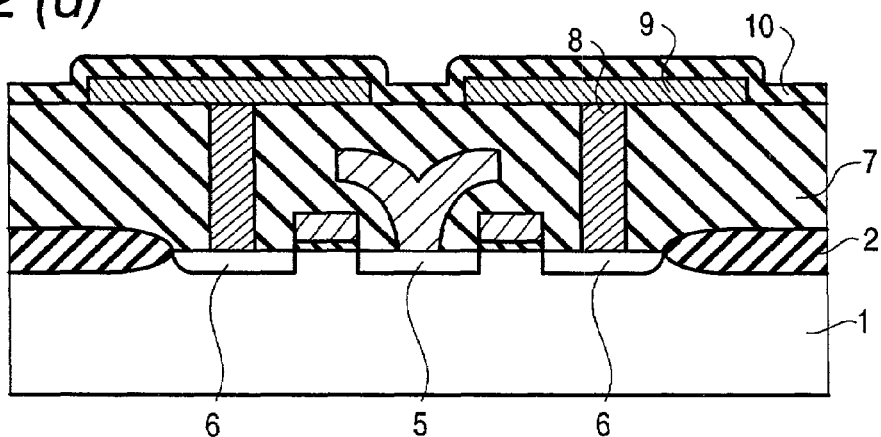

By an ordinary method, first of all, the gate electrode 4 is formed on the surface of the silicon substrate 1 through the gate insulating film 3, and an impurity diffusion is carried out by using the gate electrode 4 as a mask, thereby forming the source region 5 and the drain region 6 (FIG. 2(a)).

Subsequently, the whole surface is first subjected to a nitric acid treatment to form a hydrophobic layer. Then, a porous silica thin film is formed to have a porous structure in which a cylindrical vacancy is oriented in parallel with the surface of the substrate (FIG. 2(b)).

Figure 3:
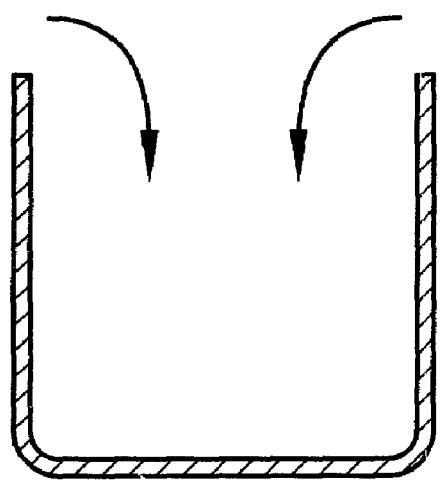
Figure 3:
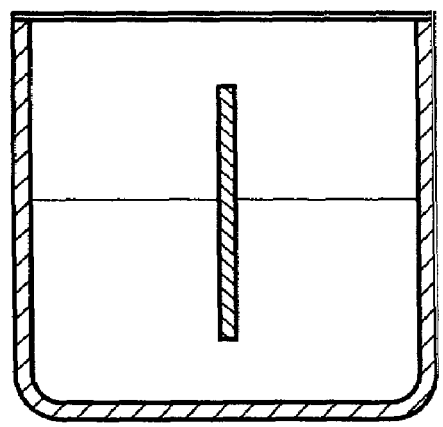

More specifically, as shown in FIG. 3(a), cation type cetyltrimethylammonium bromide (CTAB:$C_{16}H_{33}N^+(CH_3)_3$) to be a surfactant, tetramethoxy silane (TMOS) to be a silica derivative and hydrochloric acid (HCl) to be an acid catalyst are first dissolved in an $H_2O$/alcohol mixed solvent to prepare a precursor solution in a mixing vessel. The mixture is carried out in a mole ratio of preparation of the precursor solution of 0.05 of the surfactant, 0.1 of the silica derivative and 2 of the acid catalyst for 100 of the solvent. The substrate having the MOSFET formed thereon is immersed in the mixed solution, and the mixing vessel is hermetically closed as shown in FIG. 3(b) and is then held at 30 to 150° C. for 1 to 120 hours to polymerize the silica derivative by a hydrolytic polycondensation reaction (a preliminary crosslinking step), thereby forming a mesoporous silica thin film in which the periodic autoaggregate of the surfactant is used as a template.

Figure 4:
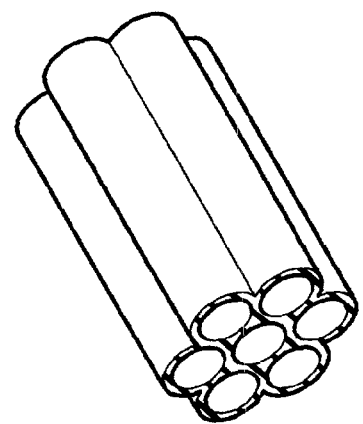
FIGS. 4(a)–4(d) show views illustrating the insulating film according to the first embodiment of the invention.
Figure 4:
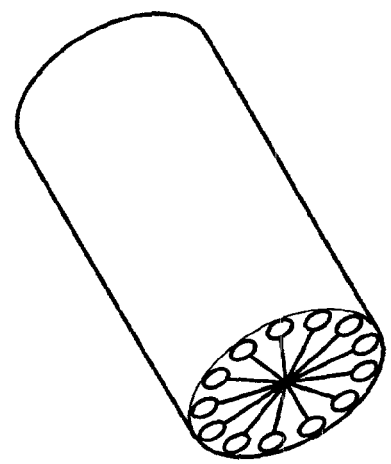
Figure 4:
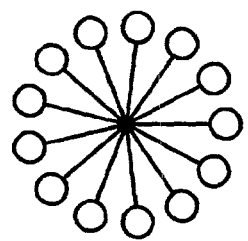
Figure 4:
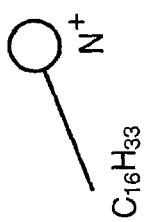

In the autoaggregate, a spherical micell structure (FIG. 4(b)) having a plurality of molecules agglutinated is formed, each molecule being $C_{16}H_{33}N^+(CH_3)Br^-$, and a cylinder (FIG. 4(d)) having a surfactant oriented is formed with an increase in a concentration (FIG. 4(c)) as shown in FIG. 4(a).

Then, the substrate is pulled up and is then washed and dried, and subsequently, is heated and burned for 3 hours at 400° C. in the oxygen atmosphere, and the surfactant of the template is completely decomposed thermally and removed to form a pure porous silica thin film.

Thus, the thin film 7 having a low dielectric constant according to the embodiment of the invention is formed as shown in FIG. 2(b). Since the bit line BL is actually provided, the thin film having a low dielectric constant is to be separately formed twice.

Then, a contact hole 8 is formed on the thin film 7 having a low dielectric constant by an ordinary method. A polycrystalline silicon layer doped in a high concentration is buried in the contact hole, thereby forming a plug. Thereafter, sputtering is carried out with a mixed gas of argon and oxygen by using iridium as a target, thereby forming an iridium oxide layer. Furthermore, a platinum layer is formed on the iridium oxide layer by using platinum as a target. As shown in FIG. 2(c), thus, an iridium oxide layer having a thickness of approximately 50 nm and a platinum layer having a thickness of approximately 200 nm are formed and are then patterned by photolithography, thereby forming the lower electrode 9.

Subsequently, a PZT film is formed as the ferroelectric film 10 on the lower electrode 9 by a sol-gel method. As a starting material, a mixed solution of $Pb(CH_3COO)_2 \cdot 3H_2O$, $Zr(t-OC_4H_9)_4$ and $Ti(i-OC_3H_7)_4$ is used. After spin coating, the mixed solution is dried at 150° C. and is temporarily burned for 30 minutes at 400° C. in the dry air atmosphere. This operation is repeated five times and a heat treatment is then carried out at 700° C. or more in the $O_2$ atmosphere. Thus, the ferroelectric film 10 having a thickness of 250 nm is formed. Herein, x is set to 0.52 in $PbZr_xTi_{1-x}O_3$ (hereinafter referred to as PZT(52/48)) and a PZT film is thus formed (FIG. 2(d)).

Furthermore, a laminated film 11 comprising iridium oxide and iridium is formed on the ferroelectric film 10 by sputtering. The laminated film comprising the iridium oxide layer and the iridium layer is set to be an upper electrode 11. The iridium layer and the iridium oxide layer are formed to have a thickness of 200 nm together. Thus, a ferroelectric capacitor can be obtained and the FRAM shown in FIG. 1 can be formed.

According to such a structure, the interlayer insulating film is constituted by a thin film having a low dielectric constant which is formed by a mesoporous silica thin film having a periodic porous structure including a cylindrical vacancy having a vacancy rate regulated by the hydrophobic treatment. Therefore, it is possible to form an FRAM in which a capacitance caused by the interlayer insulating film can be reduced, an excellent switching characteristic can be obtained and a high-speed operation can be carried out.

Moreover, the surface of the substrate having the insulating film and the substrate surface mixed thereon is subjected to the hydrophobic treatment and the interlayer insulating film is formed thereon. Therefore, a low dielectric constant can be uniformly obtained over the whole surface of the substrate, and furthermore, it is possible to employ such a closed structure that an opening portion is not provided for the lower electrode and wiring to be upper layers and the substrate. Thus, it is possible to obtain an effective thin film having a low dielectric constant which has an excellent moisture resistance and a high reliability. Accordingly, a leakage current is not generated and an interlayer insulating film can have a long lifetime.

The composition of the precursor solution is not restricted to that of the embodiment but it is desirable to take a composition of 0.05 to 0.5 of a surfactant, 0.1 to 1 of a silica derivative, and 0 to 5 of an acid catalyst for 100 of a solvent. By using a precursor solution having such a structure, it is possible to form an insulating film having a low dielectric constant with a porous structure including a cylindrical vacancy.

Moreover, while the cation type cetyltrimethylammonium bromide (CTAB:$C_{16}H_{33}N^+(CH_3)_3Br^-$) is used as the surfactant in the embodiment, the invention is not restricted thereto but it is a matter of course that another surfactant may be used.

If an alkali ion such as an Na ion is used as a catalyst, a deterioration is caused. Therefore, it is desirable that a cation type surfactant should be used as a semiconductor material and an acid catalyst should be used as a catalyst. For the acid catalyst, it is also possible to use nitric acid ($HNO_3$), sulfuric acid ($H_2SO_4$), phosphoric acid ($H_3PO_4$) and $H_4SO_4$ in addition to HCl.

Furthermore, the silica derivative is not restricted to TMOS but a silicon alkoxide material such as tetraethoxy silane (TEOS) is desirably used.

Moreover, while the water $H_2O$/alcohol mixed solvent is used as a solvent, only water is enough.

Furthermore, while the oxygen atmosphere is used for the burning atmosphere, the invention can be applied in the air, under a reduced pressure or in the nitrogen atmosphere. Desirably, burning using a foaming gas comprising a mixed gas of nitrogen and hydrogen is added so that a moisture resistance can be enhanced and a leakage current can be reduced.

In addition, it is possible to properly change the mixing ratio of the surfactant, the silica derivative, the acid catalyst and the solvent.

Furthermore, the preliminary crosslinking step is held for 1 to 120 hours at 30 to 150° C., it is desirably held at 60 to 120° C. and more desirably 90° C.

Moreover, while the burning step is held for 1 hour at 400° C., it may be held for approximately 1 to 5 hours at 300 to 500° C. and desirably 350 to 450° C.

Second Embodiment

Figure 5:
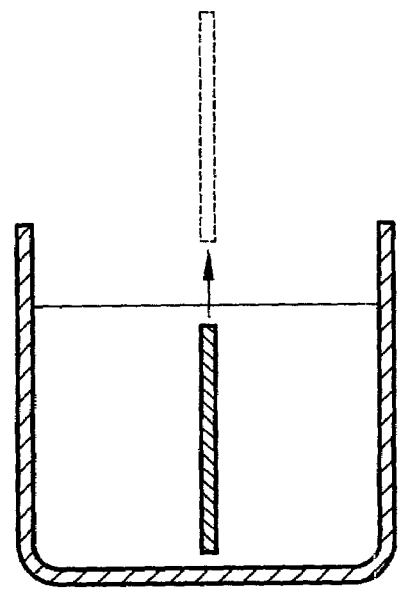
FIG. 5 is a view illustrating a process for forming an insulating film according to a second embodiment of the invention.

While the mesoporous silica thin film is formed by the immersion in the precursor solution in the first embodiment, the invention is not restricted to the immersion but a dip coating method may be used as shown in FIG. 5.

More specifically, a substrate is caused to descend vertically at a speed of 1 mm/s to 10 m/s with respect to the liquid level of a regulated precursor solution and is thus sunk in the solution, and is stationarily put for zero second to one hour.

After a desirable time passes, the substrate is vertically lifted again at a speed of 1 mm/s to 10 m/s and is then taken out of the solution.

Finally, burning is carried out in the same manner as in the first embodiment. Consequently, a surfactant is completely decomposed thermally and removed to form a pure porous silica thin film in which a cylindrical vacancy is oriented.

In the substrate immersing method, condensation is caused during the immersion, and a mesoporous silica film is formed when the substrate is present in a solution. Therefore, the rate of silica to a whole volume is increased. On the other hand, the condensation is not caused during dipping by the dipping method. Therefore, a film is not formed when the substrate is present in the solution, and the mesoporous silica film is formed during drying. Therefore, the rate of the silica to the whole volume is increased. There is such a characteristic that a thick film is formed when pull-up is carried out at a high speed, and a thin film is formed when the pull-up is carried out at a low speed.

Moreover, the dipping may be carried out after the precursor solution is treated for approximately 1 hour or 3.5 hours to perform preliminary crosslinking.

Third Embodiment

Figure 6:
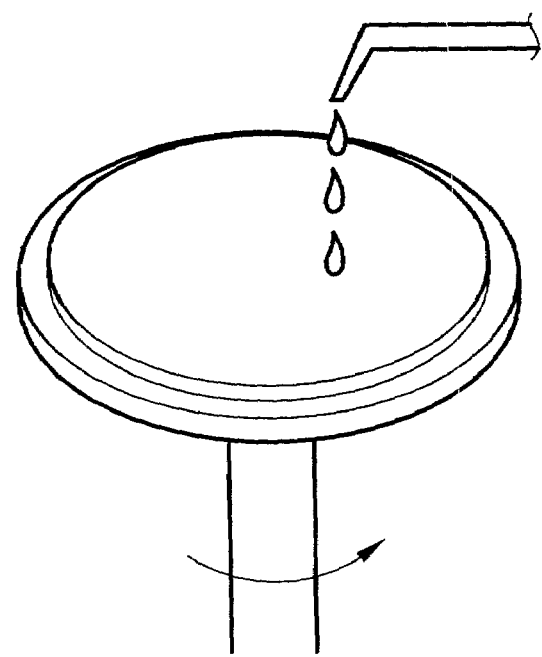
FIG. 6 is a view illustrating a process for forming an insulating film according to a third embodiment of the invention.

While the mesoporous silica thin film is formed by the immersion in the precursor solution in the first embodiment, the invention is not restricted to the immersion but a spin coating method may be used as shown in FIG. 6.

The precursor solution formed in the same manner as in the embodiments is dropped onto the surface of a substrate to be treated which is mounted on a spinner and is rotated at 500 to 5000 rpm so that a mesoporous silica thin film is obtained.

Finally, burning is carried out in the same manner as in the first embodiment. Consequently, a surfactant is completely decomposed thermally and removed to form a pure porous silica thin film in which a cylindrical vacancy is oriented.

According to such a structure, the porous structure including a vacancy arranged cylindrically is employed. Therefore, a mechanical strength can be increased and an insulating film having a high reliability can be obtained. Moreover, in the case in which the insulating film is to be used as an interlayer insulating film, it is possible to employ such a closed structure that an opening portion is not provided for an upper wiring and a lower wiring. Thus, the insulating film can serve as an effective thin film having a low dielectric constant in which a moisture resistance is excellent and a reliability is high.

Fourth Embodiment

Figure 7:
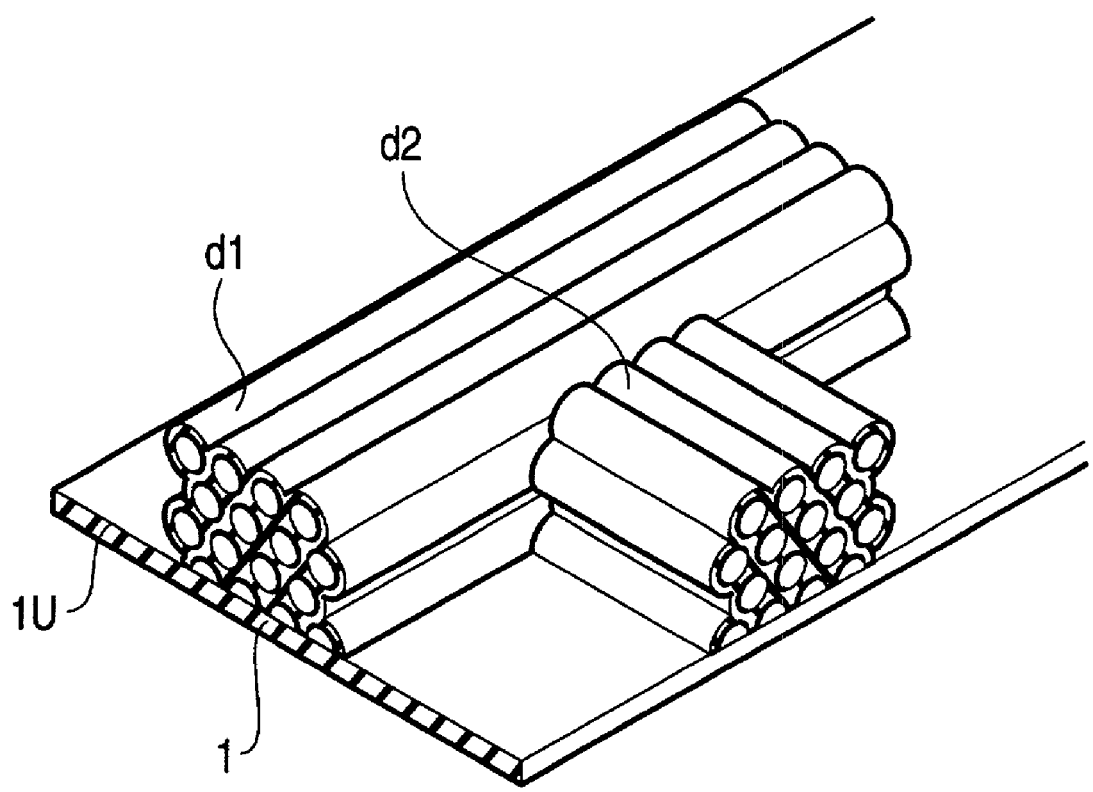
FIG. 7 is a view illustrating an insulating film according to a fourth embodiment of the invention.

While the porous structure having a cylindrical vacancy oriented in one direction has been described in the first embodiment, it is also effective to comprise a plurality of periodic porous structure domains including a cylindrical vacancy oriented in one direction in parallel with the surface of the substrate 1 subjected to a hydrophilic treatment and provided with a hydrophilic layer 1u as shown in FIG. 7. Adjacent porous structure domains d1 and d2 are oriented in different directions from each other.

According to such a structure, it is possible to form an insulating film having a more uniform dielectric constant.

In the case in which CATB is used as a surfactant and TEOS is used as a silica derivative, particularly, it is apparent that a structure thus obtained is changed depending on their ratio and the polarity of the substrate, that is, whether the substrate is hydrophilic or hydrophobic.

For example, when the molar ratio of the surfactant and the silica derivative such as CATB/TEOS is 0.3 to 0.8, it is apparent that a network structure (cubic) is obtained. When the molar ratio is smaller, that is, 0.1 to 0.5, an insulating film having a low dielectric constant including a cylindrical vacancy oriented is obtained. On the other hand, the molar ratio is greater, that is, 0.5 to 2, an insulating film having a low dielectric film including a layered vacancy oriented is obtained.

Moreover, when the molar ratio of the surfactant and the silica derivative is 0.3 to 0.5, it is apparent that the network structure (cubic) is obtained if the surface of the substrate is hydrophobic, while a cylindrical structure is approximated if the surface of the substrate is hydrophilic. Moreover, when the molar ratio is greater, that is, 0.5 to 0.8, it is apparent that a layered structure is obtained if the surface of the substrate is hydrophobic, while the network structure is approximated if the surface of the substrate is hydrophilic.

Furthermore, while cation type cetyltrimethylammonium bromide (CTAB:$C_{16}H_{33}N^+(CH_3)_3Br^-$) has been used as the surfactant in the embodiment, the invention is not restricted thereto but it is apparent that another surfactant may be used.

In addition, while the interlayer insulating film of the FRAM has been described in the embodiment, the invention can also be applied to various semiconductor devices using silicon, a high-speed device including a device using a compound semiconductor such as HEMT, a high frequency device such as a microwave IC, a high integrated ferroelectric memory of an MFMIS type, a microwave transmission line using a film carrier or a multilayer wiring board.

As described above, according to the invention, an inorganic insulating film having a porous structure including a cylindrical vacancy oriented in parallel is formed on the surface of a substrate subjected to a hydrophilic treatment or a hydrophobic treatment. By reforming a substrate layer forming the inorganic insulating film having a vacancy by a hydrophobic or hydrophilic layer having a molecular level, therefore, it is possible to easily regulate a vacancy rate and to adjust a dielectric constant with the mechanical strength of the film maintained.

According to such an inorganic insulating film, moreover, it is possible to enhance a moisture resistance. It is possible to easily form a desirable porous structure with a high controllability. Thus, it is possible to obtain an insulating film having a high mechanical strength and a low dielectric constant.

What is claimed is:

1. A method of manufacturing a semiconductor device comprising:
    a step of generating a precursor solution containing a silica derivative and a surfactant;
    a suface regulating step of carrying out a hydrophobic treatment or a hydrophilic treatment on a surface of a substrate;
    a contact step of causing the precursor solution to come in contact with the surface of thc treated substrate; and
    a step of burning the substrate with which the precursor solution is caused to come in contact and decomposing and removing the surfactant,
    wherein an insulating film having a plurality of porous structures, each porous structure defined by substantially all cylindrical vacancies is formed such that the cylindrical vacancies in each porous structure are oriented such that they are substantially parallel with the surface of the substrate, substantially all the cylindrical vacancies in each porous structure are arranged at periodic intervals, and the cylindrical vacancies of adjacent porous structures are oriented in different directions, and
    the surface regulating step is performed by using a surface regulating solution, the surface regulating solution being different from the precursor solution used in the contact step.

2. The method of manufacturing a semiconductor device according to claim 1, further comprising a preliminary crosslinking step of raising a temperature of the precursor solution to start a crosslinking reaction.

3. The method of manufacturing a semiconductor device according to claim 1, wherein the surface regulating step is a hydrophobic treating step of immersing the surface of the substrate in a nitric acid solution.

4. The method of manufacturing a semiconductor device according to claim 1, wherein the substrate is immersed in the precursor solution and is pulled up at a desirable speed in the contact step.

5. The method of manufacturing a semiconductor device according to claim 1, wherein the substrate is coated with the precursor solution at the contact step.

6. The method of manufacturing a semiconductor device according to claims 1, wherein the contact step is a spin coating step of dropping the precursor solution onto the substrate and rotating the substrate.

* * * * *